United States Patent
Najafi et al.

(10) Patent No.: US 8,209,857 B2
(45) Date of Patent: Jul. 3, 2012

(54) METHOD OF MAKING A THIN FILM DEVICE

(75) Inventors: Khalil Najafi, Ann Arbor, MI (US); Ethem Erkan Aktakka, Ann Arbor, MI (US); Hanseup Kim, Salt Lake City, UT (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 12/819,827

(22) Filed: Jun. 21, 2010

(65) Prior Publication Data
US 2011/0012478 A1 Jan. 20, 2011

Related U.S. Application Data

(60) Provisional application No. 61/269,096, filed on Jun. 19, 2009.

(51) Int. Cl.
*H05K 3/30* (2006.01)
(52) U.S. Cl. .................. 29/832; 29/825; 29/840; 29/846
(58) Field of Classification Search .................... 29/825, 29/832, 840, 846
See application file for complete search history.

(56) References Cited

U.S. PATENT DOCUMENTS

| | | |
|---|---|---|
| 3,868,719 A | 2/1975 | Kurtz et al. |
| 4,434,384 A | 2/1984 | Dunnrowicz et al. |
| 4,582,240 A | 4/1986 | Lux et al. |
| 5,260,596 A | 11/1993 | Dunn et al. |
| 5,446,330 A | 8/1995 | Eda et al. |
| 5,448,126 A | 9/1995 | Eda et al. |
| 6,017,822 A | 1/2000 | Mountain |
| 6,335,263 B1 | 1/2002 | Cheung et al. |
| 6,445,265 B1 | 9/2002 | Wright |
| 6,450,039 B1 | 9/2002 | Masuda |
| 6,465,271 B1 | 10/2002 | Ko et al. |
| 6,512,323 B2 | 1/2003 | Forck et al. |

(Continued)

FOREIGN PATENT DOCUMENTS

CN 101298997 A * 11/2008

OTHER PUBLICATIONS

J. Cheong et al, "Piezoelectric micro-flextensional actuator", MEMS/MOEMS Components and Their Applications, Proceedings of SPIE vol. 5344, 2004, pp. 106-114.

(Continued)

*Primary Examiner* — Carl Arbes
(74) *Attorney, Agent, or Firm* — Howard & Howard Attorneys PLLC (57) ABSTRACT

A thin-film device and a method of fabricating the thin-film device are provided herein. The thin-film device comprises a bond layer, a film layer that has bulk material properties, and a substrate that has a heat-sensitive component disposed thereon. The method of fabricating the thin-film device comprises the step of providing an active material that has bulk material properties. The active material is bonded to the substrate through the bond layer. After bonding the active material to the substrate, the active material that is bonded to the substrate is thinned to produce the film layer of the thin-film device. The substrate is provided with the heat-sensitive component disposed thereon prior to bonding the active material to the substrate.

17 Claims, 6 Drawing Sheets

U.S. PATENT DOCUMENTS

| | | |
|---|---|---|
| 6,767,749 B2 | 7/2004 | Kub et al. |
| 6,919,668 B2 | 7/2005 | Nagahara et al. |
| 6,921,603 B2 | 7/2005 | Morse et al. |
| 6,956,268 B2 | 10/2005 | Faris |
| 7,006,334 B2 | 2/2006 | Uchiyama |
| 7,084,554 B2 | 8/2006 | Xu et al. |
| 7,089,635 B2 | 8/2006 | Xu et al. |
| 7,118,990 B1 | 10/2006 | Xu et al. |
| 7,234,214 B2 | 6/2007 | Xu et al. |
| 7,250,101 B2 | 7/2007 | Thompson et al. |
| 7,290,336 B2 | 11/2007 | Buhler et al. |
| 7,329,364 B2 | 2/2008 | Ho et al. |
| 7,538,401 B2 | 5/2009 | Eriksen et al. |
| 7,574,787 B2 | 8/2009 | Xu et al. |
| 7,591,542 B2 | 9/2009 | Sugahara |
| 7,595,581 B2 | 9/2009 | Aoki et al. |
| 7,612,635 B2 | 11/2009 | Huang |
| 7,642,115 B2 | 1/2010 | Eriksen et al. |
| 7,671,515 B2 | 3/2010 | Metz et al. |
| 2004/0246312 A1 | 12/2004 | Moriya et al. |
| 2007/0210878 A1 | 9/2007 | Yamaguchi et al. |
| 2007/0257580 A1 | 11/2007 | Chen et al. |
| 2009/0050987 A1 | 2/2009 | Peng et al. |
| 2009/0218641 A1 | 9/2009 | Melville et al. |

OTHER PUBLICATIONS

J. Cheong et al., "Reliable Bonding Using in Based Solders", Reliability, Testing, and Characterization of MEMS/MOEMS III, Proceedings of SPIE vol. 5343, 2004, pp. 114-120.

J. -P. Desbiens et al., "ArF excimer laser micromachining of Pyrex, SiC and PZT for rapid prototyping of MEMS components", Sensors and Actuators A 136, 2007, pp. 554-563.

K. Eda et al., Matsushita Electric Industrial Co., Ltd. "Direct Bonding of Piezoelectric Materials on Si" IEEE,1996, pp. 719-722.

N. W. Hagooda et al., "Micro Hydraulic Transducer Technology for Actuation and Power Generation," Smart Structures and Materials 2000: Smart Structures and Integerated Systems, Proceedings of SPIE vol. 3985, 2000, pp. 680-688.

M. J. Hucker et al., "Integrating bulk piezoelectric materials into MEMS for high authority actuators", BAE Systems Advanced Technolgy Centre, J. Micromech. Microeng. 17, 2007, pp. 1549-1557. Paper Retracted.

J.-K. Jung, et al., "Dry Etching Characteristics of Pb(Zr,Ti)O3 Films in CF4 and C12/CF4 Inductively Coupled Plasmas", Jpn J. Appl Phys. vol. 40,, 2001, pp. 1408-1419.

H. Kim et al., IEEE/ASME., "Characterization of Low-Temperature Wafer Bonding Using Thin-Film Parylene", J. Microelectromech. Syst., 14, 2004, pp. 1347-1355.

T. Li et al., "A Die-Scale Micromachining Process for Bulk PZT and Its Applications to In-plane Actuators" MEMS, 2005, pp. 387-390.

J. Marshall et al., "FIB Milled PZT Nanocapacitors Tested Using PFM", Integrated Ferroelectrics, vol. 61, 2004, pp. 223-230.

G. Sasaki et al., "Mechanism of the anodic bonding between PZT ceramics and silicon wafer", Materials Chemistry and Physics 51, 1997, pp. 174-177.

H. Takagi et al., "Room-temperature bonding of lithium niobate and Silicon wafers by argon-beam surface activation", Applied Physics Letters, vol. 74, No. 16, 1999, pp. 2387-2389.

K. Turner et al, "Bonding of Bulk Piezoelectric Material to Silicon Using a Gold-Tin Eutectic Bond" Mat. Res. Soc. Symp. Proc. vol. 687, 2002, B3.2.1-B3.2.6.

L.-P. Wang et al., "Wet-etch Patterning of Lead Zirconate Titanate (PZT) Thick Films for Micro-electro-mechanical Systems (MEMS) Applications", Mat. Res. Soc. Symp. Proc. vol. 657, 2001, pp. EE5.39.1-EE5.39.6.

W.C. Welch, "Vacuum and Hermetic Packaging of MEMS Using Solder", PhD Thesis, Univ. of Michigan, 2007.

X.-H. Xu et al., "Design, fabrication and characterization of a bulk-PZT-actuated MEMS deformable mirror", J. Micromech. Microeng. 17, 2007, pp. 2439-2446.

X.-H. Xu et al., "Integration of displacement sensor into bulk PZT thick film actuator for MEMS deformable mirror", Sensors adn Actuators A: Physical, 147, 2008, pp. 242-247.

International Search Report for International Application No. PCT/US2010/039359, Feb. 22, 2011, 3 pages.

E.E. Aktakka et al., "Wafer Level Fabrication of High Performance MEMS Using Bonded and Thinned Bulk Piezoelectric Substrates", Transducers, 2009, pp. 849-852.

J. Cheong et al., "Fabrication and Performance of a Flextensional Microactuator", J. Micromech. Microeng. 15 , 2005, pp. 1947-1955.

K. Eda et al., "Novel Composite Piezoelectric Materials Using Direct Bonding Techniques", IEEE Ultrasonics Symposium, 1995, pp. 921-924.

R. Elfrink et al., "Vacuum Packaged MEMS Piezoelectric Vibration Energy Harvesters", PowerMEMS, 2009, pp. 67-70.

B.S. Lee et al., "Piezoelectric MEMS generators fabricated with an aerosol deposition PZT thin film", J. Micromech. Microeng, vol. 19, 2009. p. 1-8.

M. Renaud et al., "Fabrication modelling and characterization of MEMS piezoelectric vibration harvesters", Sensors and Actuators A, 145-146, 2008, pp. 380-386.

S. Roundy et al., "A Study of low level vibrations as a power source for wireless sensor nodes", Comput Commun., 26, 2003, pp. 1131-1144.

D. Shen et al., "The design, fabrication and evaluation of a MEMS PZT cantilever with an integrated Si proof mass for vibration energy harvesting", J Micromech. Microeng vol. 18, 2008, pp. 1-7.

K. Tanaka et al., "Fabrication of Microdevices Using Bulk Ceramics of Lead Zirconate Titanate", Japanese Journal of Applied Physics, vol. 44, No. 9B, 2005, pp. 7068-7071.

Z. Wang et al., "Fabrication of piezoelectric MEMS devices-from thin film to bulk PZT wafer", J. Electroceram (2008), pp. 24:25-32.

X.-H. Xu et al., "Preparation of a high-quality PZT thick film with performance comparable to those of bulk materials for applications in MEMS", J. Micromech. Microeng. 18, 2008, pp. 1-7.

* cited by examiner

METHOD OF MAKING A THIN FILM DEVICE

CROSS-REFERENCE TO RELATED APPLICATIONS

The subject patent application claims priority to, and all the benefits of, U.S. Provisional Patent Application Ser. No. 61/269,096 filed on Jun. 19, 2009. The entirety of this provisional patent application is expressly incorporated herein by reference.

GOVERNMENT LICENSE RIGHTS

This invention was made with government support under grant number N66001-07-1-2006 awarded by NAVY/SPAWAR for Hybrid Insect MEMS. The government has certain rights in the invention.

BACKGROUND OF THE INVENTION

1. Field of the Invention

The instant invention generally relates to a thin-film device and a method of fabricating the thin-film device. More specifically, the instant invention relates to a method of fabricating a thin-film device having a film layer that has bulk material properties.

2. Description of the Related Art

There are various possible applications of "smart" materials, such as piezoelectric materials, both in micro-electromechanical systems (MEMS) devices and in solid state devices. From a MEMS device perspective, piezoelectricity provides several advantages over electromagnetic or electrostatic conversion phenomenon, since its electromechanical conversion phenomena is fairly simple and effective. Just to name a few of these advantages; the stroke of an actuator is not limited by a pulling voltage as in electrostatic actuators, the resultant force is considerably higher, there is no need for a bulk heavy electromagnet in the design, and it is much more practical to scale down devices. From a solid-state device perspective, a ferroelectric material layer (which is a type of piezoelectric material) can modulate an adjacent semiconductor layer through induced charge, and opens possibilities of controlled band bending, memory device applications, and various sensor applications.

Typical fabrication methods for piezoelectric thin films involve great challenges such as a need for high temperature processing, propensity of stress-induced cracking in the piezoelectric thin films, limited film thickness, and reliability and repeatability issues. The piezoelectric thin films produced through the typical fabrication methods also suffer from low piezoelectric coefficients. Several methods are known for fabrication of piezoelectric thin films on silicon substrates. A few of the most widely-known fabrication methods are sol-gel deposition, direct writing (ink-jet printing), screen printing, sputtering, electrophoretic deposition, and epitaxial growth. Unfortunately, as listed in Table 1, all of these fabrication methods result in considerably lower piezoelectric properties in the piezoelectric thin films than the same material's bulk properties. Another problem is that among these fabrication methods, except screen printing and electrophoretic deposition, thickness of the piezoelectric film layers is limited to about 1 µm to 3 µm. Additionally, high temperature annealing processes are common for the piezoelectric thin films fabricated through the above methods to form a preferred crystal orientation in the piezoelectric thin films and to initiate piezoelectric properties in the piezoelectric thin films. Such high temperature annealing processes constrain an ability to fabricate the piezoelectric thin films on substrates in a post-CMOS fabrication process, under which conditions the substrates include heat-sensitive components such as integrated circuits disposed thereon.

TABLE 1

| Deposition Methods | Piezoelectric Coupling k31 | Material Thickness | Min Process Temperature | Process Challenges |
| --- | --- | --- | --- | --- |
| Bulk Ceramics | 0.15-0.35 (Wide range of selection) | >100 µm | Bonding Temperature | Difficult to Achieve a Reliable low temp. bond, Limited to Thick Layers |
| Screen Printing Molding/Casting | <0.090 | 10-100 µm | 600° C.-900° C. | Poor Pattern resolution, Requires a Slurry Composition, Limited to High Temperature Bonding |
| Sol-gel PZT | 0.060-0.090 | <3 µm | 400° C.-700° C. | High stress, Shrinkage, Cracking, Substrate Effect, Limited to High Temperature Bonding |
| Sputtered PZT | 0.070 | <2-3 µm | 450° C.-650° C. | Crystal orientation Uniformity, Limited to High Temperature Bonding |
| Sputtered AlN | 0.017-0.030 | <2 µm | 20° C.-400° C. | Limited to Non-ferroelectric Materials Limited to Small Thickness |
| Sputtered ZnO | 0.049 | <2 µm | 20° C.-275° C. | Fast diffusion of Zn, Low DC Resistivity, Limited to Small Thickness |

As compared to piezoelectric thin films deposited through the above-reference fabrication methods, bulk piezoelectric materials provide greater electromechanical force, structural strength, and charge capacity, which are highly desirable properties in many MEMS devices including high-force actuators, harsh-environmental sensors, and micro-power scavengers. Physical properties of other bulk "smart" materials, such as thermoelectric, electrostrictive, magnetoelastic, ferromagnetic, ferromagnetic, and shape memory materials, are similarly improved over their thin-film counterparts. In view of the superior physical properties of the bulk piezoelectric materials as compared to piezoelectric thin films fabricated through the above-referenced methods, it is desirable to integrate bulk piezoelectric materials into thin-film devices.

Thin bulk piezoelectric materials have been integrated on MEMS devices and solid state devices in the past, but existing methods have suffered from one or more of the following problems: excessive bonding temperatures for bonding the thin bulk piezoelectric materials directly on the devices, an inability to successfully bond the thin bulk piezoelectric materials to the devices without experiencing cracking or delamination, an inability to directly form the thin bulk piezoelectric materials on the devices, and associated manufacturing inefficiencies stemming from an inability to form the thin bulk piezoelectric materials directly on the devices.

In one specific example of a known method, a bulk piezoelectric material is deposited and bonded onto a substrate. After bonding the bulk piezoelectric material to the substrate, the bulk piezoelectric material is thinned to obtain a thin piezoelectric material. An electrode is deposited on top of the thin piezoelectric material to form a thin piezoelectric device, which is subsequently bonded to a MEMS device. The thin piezoelectric device is formed outside of the CMOS environment (i.e., the substrate upon which the thin piezoelectric device is formed is not a MEMS device) and employs high temperature sintering processes to initially bond the bulk piezoelectric material to the substrate. However, the MEMS devices have heat-sensitive components disposed thereon which cannot withstand the temperatures required by the sintering process such that it would not be possible to form the thin piezoelectric devices directly on the MEMS devices in this method. Furthermore, the thin piezoelectric device is completely formed at the stage in which the device is bonded to the MEMS device such that no modification of the piezoelectric material is possible once the thin piezoelectric device is bonded to the MEMS device.

In view of the foregoing, there remains an opportunity to further improve upon existing methods of fabricating thin-film devices that include bulk piezoelectric materials.

SUMMARY OF THE INVENTION AND ADVANTAGES

A thin-film device and a method of fabricating the thin-film device are provided herein. The thin-film device comprises a bond layer, a film layer that has bulk material properties, and a substrate that has a heat-sensitive component disposed thereon. The method of fabricating the thin-film device comprises the step of providing an active material that has bulk material properties. The active material is bonded to the substrate through the bond layer. After bonding the active material to the substrate, the active material that is bonded to the substrate is thinned to produce the film layer of the thin-film device. The substrate is provided with the heat-sensitive component disposed thereon prior to bonding the active material to the substrate.

By bonding the active material to the substrate having the heat-sensitive component disposed thereon prior to thinning the active material, packaging space may be minimized and processing efficiencies may be realized as compared to prior art processes that involve thinning of bulk materials prior to bonding the thinned bulk materials to a device having a heat-sensitive component disposed thereon. Furthermore, by thinning the active material after bonding, a more integrated device may be prepared as compared to prior art devices. Further still, damage of the film layer may be minimized by performing the step of thinning once the active material is already bonded to the substrate that has the heat-sensitive component disposed thereon.

DESCRIPTION OF THE SEVERAL VIEWS OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

A thin-film device 10 and a method of fabricating the thin-film device 10 are provided herein. The thin-film devices 10 comprise a bond layer 16 and a film layer 22. The thin-film devices 10 further comprise a substrate 14 having a heat-sensitive component 44 disposed thereon, with the bond layer 16 disposed between the film layer 22 and the substrate 14. The heat-sensitive component 44 may be a component whose physical, chemical, and/or functional properties are materially altered at elevated temperatures such as, e.g., temperatures above 300° C. For example, the heat-sensitive component 44 may be a structure having a low-melting temperature, such as a thermoplastic. As another example, the heat-sensitive component 44 may be a sensitive electronic component such as an integrated circuit or a processor.

Examples of thin-film devices 10 in accordance with the instant invention include, but are not limited to, piezoelectric micro-electro-mechanical (MEMS) devices and solid-state devices. Specific examples of thin-film devices 10 in accordance with the instant invention include, but are not limited to, micro-pumps, micro valves, bio-molecular sensors, energy scavenging devices, micro mirrors, cantilever arrays for atomic force microscopy, micro heaters, surface acoustic wave (SAW) devices, memory devices, micro diaphragms for ultrasonic imaging, micro motors, tunable capacitors, resonators, filters, micro-switches, microphones, micro-speakers, accelerometers, ferroelectric/semiconductor capacitors, and thin-film-transistors. Various specific devices are described in further detail below. The instant method may involve die-level fabrication of the thin-film devices 10, in which multiple thin-film devices 10 may be fabricated on the same substrate 14 (i.e., film layers 22 isolated from each other by some distance), or wafer-level fabrication, in which a single device 10 (i.e., a single film layer 22 covering nearly the whole substrate 14 surface) is formed on the substrate 14.

The film layer 22 of the thin-film devices 10 has bulk material properties, as opposed to properties that are generally associated with thin films that are formed through deposition processes such as chemical vapor deposition. Bulk materials are generally commercially available as thick (>100 µm) substrates 14 or pieces, which are fabricated by processes other than thin film deposition techniques. By the nature of optimized macro-scale fabrication methods (for example molding, casting, high temperature sintering of ceramics), these bulk materials often provide highly controllable, uniform and reliable mechanical, electrical, and thermal properties. In contrast, thin films deposited by micro fabrication processes may have variable composition, contamination levels, defect density, material density, and mechanical, thermal, and electrical properties, depending on the deposition method and deposition conditions. In addition, film porosity, absorption of humidity, long term stability may also present difficulties in deposited thin films. Examples of thin film deposition techniques include physical/chemical vapor deposition, epitaxial growth, sol-gel spin-coating, and laser deposition.

The film layer 22 has the bulk material properties due to the manner in which the film layer 22 is formed in accordance with the method of the instant invention, which includes providing an active material 12 having the bulk material properties and thinning the active material 12, as described in further detail below, to form the film layer 22. In this manner, the film layer 22 retains the bulk material properties of the active material 12 after thinning.

The active material 12 is a material whose physical properties can change upon exposure to a signal, examples of which include, but are not limited to, electrical charges, an electromagnetic field, and mechanical inputs. Active materials are also known in the art as "smart" materials. Specific examples of active materials include those selected from the group of thermoelectric, piezoelectric, electrostrictive, magnetoelastic, ferromagnetic, ferromagnetic, and shape memory materials. The specific active material 12 used to fabricate the thin-film devices 10 depends upon the type of thin-film device 10 being produced. Typically, the active material 12 used in the method of the instant invention is a piezoelectric material. Pb(Zr,Ti)O$_3$ (referred to in the art as PZT) is one example of a piezoelectric material. The active material 12 typically has a polycrystalline microstructure; however, it is to be appreciated that the active material 12 can have a single crystalline microstructure.

The active material 12 is typically provided in wafer form and typically has a thickness of from about 120 µm to about 2 mm, alternatively from about 120 to about 500 µm. The active material 12 can be provided in various dimensions in terms of length and width, and the active material 12 can be cut or shaped prior to use; alternatively, the active material 12 can be provided and used in its shape as-provided without cutting the active material 12.

The method of the instant invention further comprises the step of providing the substrate 14 having the heat-sensitive component 44 disposed thereon. The substrate 14 typically comprises silicon, and is typically a silicon wafer. However, it is to be appreciated that the substrate 14 may be glass, metal, or other materials without deviating from the scope of the instant invention. In one embodiment, the substrate 14 may define a flat surface. Alternatively, the substrate 14 may have features defined on the surface thereof, such as recesses 32, as described in further detail below. In accordance with the method of the instant invention, the substrate 14 may be obtained from a supplier, or may be fabricated to include the heat-sensitive component 44, such as the integrated circuit, as a step in the method of the instant invention.

The method of fabrication typically begins with cleaning of the active material 12 with organic solvents. Once cleaned, the active material 12 is bonded to the substrate 14 to form a bond layer 16. In accordance with the method of the instant invention, the substrate 14 is provided with the heat-sensitive component 44 disposed thereon prior to bonding the active material 12 to the substrate 14. The presence of the heat-sensitive component 44 on the substrate 14 prior to bonding the active material 12 to the substrate 14 represents a significant advantage of the instant invention due to the fact that existing fabrication methods cannot support formation of the film layer 22 from active materials after bonding of the active materials to substrates having the heat-sensitive components disposed thereon.

In accordance with the instant method, the active material 12 can be bonded to the substrate 14 through various types of bond layers. Typically, active material 12 is bonded to the substrate in the same environment as the fabrication of the substrate 14 including the heat-sensitive component 44 for purposes of processing efficiency. In one embodiment, the active material 12 is provided with a bond component layer 18 disposed thereon and the substrate 14 is provided with an additional bond component layer 20 disposed thereon. However, it is to be appreciated that the method of the instant invention may include the steps of depositing the bond component layer 18 on the active material 12 and depositing the additional bond component layer 20 on the substrate 14. It is also to be appreciated that the active material 12 can be bonded to the substrate 14 without first providing the bond component layer 18 on the active material 12 and providing the additional bond component layer 20 on the substrate 14, such as in circumstances in which a bonding temperature is greater than or equal to a melting temperature of the material used to form the bond layer 16. However, under circumstances where the melting temperature of the material used to form the bond layer 16 is greater than a bonding temperature, as described below, the active material 12 and the substrate 14 are typically provided with the bond component layer 18 and the additional bond component layer 20, respectively.

The active material 12 can be polished on a face thereof prior to bonding, which may allow bond thicknesses to be minimized since conformal deposition of the bond layers 16 on the substrate 14 and coverage of the substrate 14 during bonding by reflow of the bond layer 16 will be much easier. Additionally, polishing may contribute to precise distinction between the bond layer 16 and the active material 12, and thickness variation of the active material 12 due to roughness at the surface thereof will be minimized and more uniform and reliable thin-film devices can be obtained.

Figure 2:
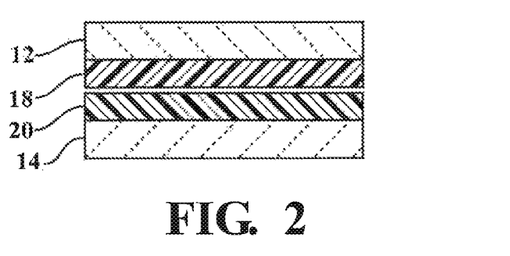
FIG. 2 is a schematic side view of various layers in another embodiment of a thin-film device fabricated in accordance with the instant invention in which an active material is bonded to a substrate through a bond layer comprising a polymer.

The active material 12 is typically bonded to the substrate 14 through the bond component layer 18 and the additional bond component layer 20, and such bonding occurs at a bonding temperature to form the bond layer 16. Because the substrate 14 has the heat-sensitive component 44 disposed thereon, the bond layer 16 must be formed with consideration of the effect of bonding conditions on the heat-sensitive component 44. Typically, the bonding temperature is less than or equal to about 300° C., more typically less than or equal to 200° C., which temperatures are sufficiently low to enable the method of fabricating the thin-film devices 10 to be used in post-CMOS fabrication processes. However, it is to be appreciated that higher bond temperatures may be employed depending upon the particular sensitivities of the heat-sensitive component 44, with care taken to avoid damage to the heat-sensitive component 44. In one embodiment, as shown in FIG. 2, a single bond component layer 18 is disposed on the active material 12, and a single additional component layer is disposed on the substrate 14. In this embodiment, the bond component layer 18 and the additional bond component layer 20 typically comprise a polymer having a melting temperature of greater than 200° C. The polymer is also typically effective to shield the active material 12 from etching under circumstances in which the substrate 14 is etched during the method of fabrication, and is further typically effective to shield the substrate 14 when the active material 12 (or film layer 22 formed therefrom) is subject to patterning. The bond component layer 18 and additional bond component layer 20 typically comprise the polymer when there is a desire for the bond layer 16 to be non-conductive. One example of a suitable polymer is parylene, such as Parylene-C. The parylene is typically present in the bond component layer 18 and the additional bond component layer 20 in an amount of 100 percent by weight, although it is to be appreciated that impurities, fillers, or other components may also be present in the bond component layer 18 and the additional bond component layer 20 in small amounts.

In another embodiment, the active material 12 is bonded to the substrate 14 through a transient liquid phase (TLP) bond to form the bond layer 16. TLP bonding is also referred to in the art as diffusion bonding. In TLP bonding, a melting temperature of the bond component layers 18, 20 is greater than the bonding temperature. Under many circumstances, it is beneficial to bond the active material 12 and the substrate 14 at the bonding temperature that is less than the melting temperature of the bond component layer 18 and the additional bond component layer 20. Specifically, lower bonding temperatures can be used under such circumstances, and the lower bonding temperatures are amenable to fabricating the thin-film devices 10 on the substrates 14 after the heat-sensitive component 44 is disposed on the substrate 14 (such as in post-CMOS bonding, in which an integrated circuit(s) is/are already present on the substrate 14). Further, when the bonding temperature is less than the melting temperature of the bond component layer 18 and the additional bond component layer 20, additional layers of the active material 12 may be bonded to the film layers 22 (once formed) without melting the bond layer 16 beneath the film layer 22. Further still, when the bonding temperature is less than the melting temperature of the bond component layer 18 and the additional bond component layer 20, the thin-film devices 10 fabricated in accordance with the instant method may be packaged at the same or higher temperature as the bonding temperature.

Figure 1:
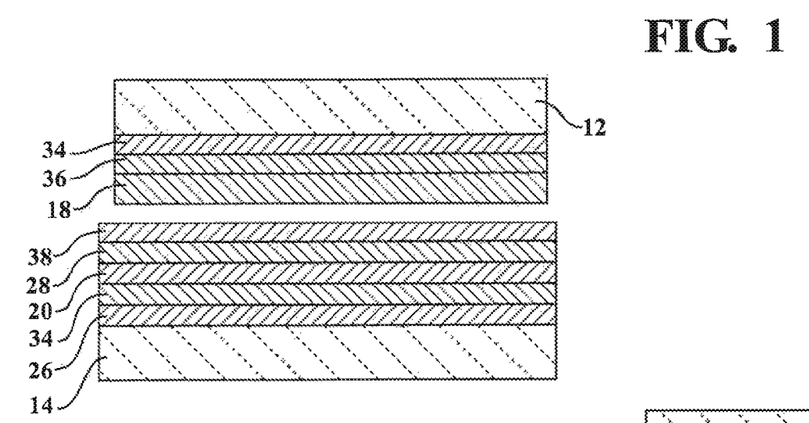
FIG. 1 is a schematic side view of various layers in a thin-film device fabricated in accordance with the instant invention in which an active material is bonded to a substrate through a transient liquid phase bond to form a bond layer.

TLP bonding is typically used when there is a desire for the bond layer 16 to be conductive. For TLP bonding in accordance with the instant method, the active material 12 and the substrate 14 are typically provided with the bond component layer 18 and the additional bond component layer 20 respectively disposed thereon. However, unlike the embodiment in which the bond component layer 18 and the additional bond component layer 20 comprise the polymer, the bond component layer 18 and the additional bond component layer 20 for TLP bonding each comprise a parent metal. TLP bonds are formed by sandwiching a low-melting point interlayer between two layers comprising the parent metals. To these ends, as shown in FIG. 1, an interlayer 28 comprising an interlayer metal is also disposed on one or more of the bond component layer 18 and the additional bond component layer 20. Table 2 lists some known TLP material systems with their reported bonding temperatures and re-melting temperatures, as reported by G. Humpston, D. M. Jacobson, Principles of Soldering. Materials Park, Ohio: ASM International, 2004, pp. xii, 271.

TABLE 2

| TLP Solder Joints | Bonding Temperature | Re-melting Temperature |
| --- | --- | --- |
| Copper-Indium | 180° C. | >307° C. |
| Copper-Tin | 280° C. | >415° C. |
| Silver-Tin | 250° C. | >600° C. |
| Silver-Indium | 175° C. | >880° C. |
| Gold-Tin | 260° C. | >278° C. |
| Gold-Indium | 200° C. | >495° C. |
| Nickel-Tin | 300° C. | >400° C. |

In Table 2, copper, silver, gold, and nickel represent parent metals in the TLP material system, while indium and tin represent interlayer metals.

In this embodiment, the active material 12 is bonded to the substrate 14 through the bond component layer 18, the additional bond component layer 20, and the interlayer 28 at a bonding temperature to form the bond layer 16. The bonding temperature is greater than a melting temperature of the interlayer 28, but is lower than a melting temperature of the bond component layers 18, 20. Upon reaching the bonding temperature, the interlayer 28 becomes molten and flows to fill any gaps in the bond component layer 18 and the additional bond component layer 20, and the interlayer metal reacts with the parent metals to form the bond layer 16. The resulting bond layer 16 that is formed through TLP bonding comprises an inter-metallic compound (IMC). As is characteristic of TLP bonding, a melting temperature of the bond layer 16 is greater than the bonding temperature. The reaction of the interlayer metal with the parent metals consumes the interlayer 28. The bond layer 16 becomes completely solid without reducing the temperature as the last of the liquid interlayer 28 is transformed into the solid bond layer 16.

TLP bonds can planarize over uneven surface topography because the interlayer 28 exists in a liquid phase during the bonding process. The interlayer 28 in the liquid phase will flow over, and conform to, any uneven topography. However, unlike a standard solder bond, the liquid phase in TLP bonding exists only temporarily during formation of the bond (hence the name Transient Liquid Phase solder bonding).

Referring to FIG. 1, additional layers may also be present on the active material 12 and/or substrate 14 prior to and, under some circumstances, after bonding of the active material 12 and the substrate 14. For example, an adhesion layer 34 may be used for promoting adhesion between the bond component layer 18 and the active material 12 (or between the additional bond component layer 20 and the substrate 14), especially when the bond component layer 18 and additional bond component layer 20 comprise a noble metal (such as parent metals for the solder bond layer 16). Chromium and titanium represent examples of suitable materials for the adhesion layer 34. The adhesion layer 34 may be in direct contact with the respective bond component layer 18 or additional bond component layer 20. Alternatively, a diffusion barrier layer 36 that is wettable but insoluble may be disposed between the adhesion layer 34 and the respective bond component layer 18 or additional bond component layer 20. The diffusion barrier layer 36 may be present to prevent consumption of the adhesion layer 34 during TLP bonding between the bond component layer 18, interlayer 28, and additional bond component layer 20. The diffusion barrier layer 36 may comprise, but is not limited to, metals selected from the group of platinum, cobalt, nickel, and combinations thereof. Consumption of the adhesion layers 34 could cause detachment of the bond layer 16 from the substrate 14 and/or active material 12. A protection layer 38 may be disposed over the interlayer 28 to prevent formation of oxides when the interlayer 28 is exposed to ambient air, which would prevent reaction of the interlayer 28 and parent metal in the bond component layer 18 and additional bond component layer 20. A thin layer of the parent metal over the interlayer 28 can act as the protection layer 38 and can provide long shelf life-time. Finally, an isolation layer 26, such as those comprising oxides, nitrides, metal oxides or polymers (such as parylene) may be used to provide electrical isolation from the carrier wafer. The isolation layer can also perform the function of a stop layer 26 or stop-etch layer 26 as described in further detail below. FIG. 1 represents a typical configuration of the various layers prior to bonding of the active material 12 and the substrate 14.

The bond layer 16 may be used in the thin-film devices 10 fabricated according to the instant method for additional purposes, such as to provide structural and/or functional features. For example, it is possible to use TLP bonding (conductive) and polymer (non-conductive) bonding at the same time, when it is desirable to have patterned electrode 48 and insulation layers on the same substrate 14 surface. In this regard, fabrication of complex multi-layer piezoelectric structures and sophisticated actuation and sensing mechanisms in the thin-film devices 10 is possible. Further, optimization of electrode regions is also possible.

Also, in terms of structural use of the bond layer 16, bond layer 16 thicknesses can be adjusted to control the thickness of the film layer 22. A deposited material may additionally be used underneath the bond layer 16 on the substrate 14 to further adjust height of the active material 12 in anticipation of thinning and/or to protect the heat-sensitive component 44 and other elements that may exist on the substrate 14 during the thinning process. As made clear below, during thinning, a stop surface 24 may be used, and the active material 12 bonded to the substrate 14 through the bond layer 16 may be thinned until a thinned surface of the active material 12 is on even plane with the stop surface 24 to produce the film layer 22. Thus, thickness of the bond layer 16 can be used to effectively raise or lower the active material 12 relative to the stop surface 24 to effectively control thickness of the resulting thin film. Bond layer 16 thickness is typically from about 1 to about 20 µm.

Various techniques may be utilized to align the active material 12 on the substrate 14 during bonding to ensure precise placement of the active material 12 on the substrate 14, especially when the instant method involves die-level fabrication of the thin-film devices 10 with multiple thin-film devices 10 fabricated on the same substrate 14. Precise alignment of the active material 12 on the substrate 14, and achievable minimum practical die area for bonding (which may be as low as 200 µm×200 µm) can enable die-level thin-film device fabrication without the necessity of patterning the active material 12 after bonding and thinning steps. For this purpose, cutting and patterning of the active material 12 from a bulk wafer before bonding can be achieved with a dicing saw.

Figure 3A:
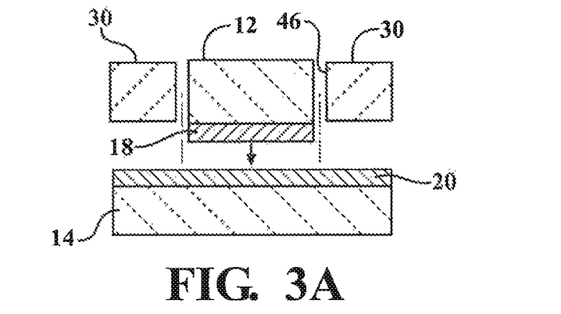
FIG. 3 is a schematic side view of three different embodiments by which an active material is aligned on a substrate during piece-wise level bonding of the active material on the substrate.
Figure 3B:
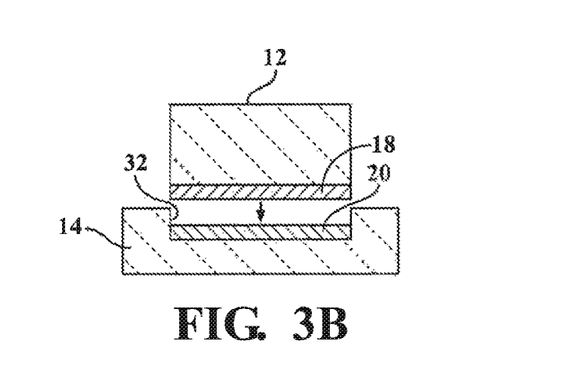
Figure 3C:
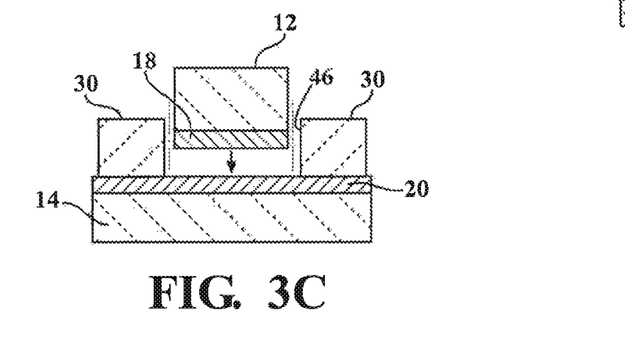

During die-level bonding of the active material 12 on substrates 14, various mechanisms may be used to align the active materials 12 on the substrates 14. Referring to FIG. 3, the active material 12 may be aligned on the substrate 14 to thereby achieve placement accuracy through at least three different mechanisms. As shown in FIG. 3(A), guide wafers 30 may be used, and the guide wafers 30 may have wafer-through holes 46 in the dimensions of the to-be-attached pieces of active material 12 that are aligned to the substrate 14. In another embodiment, as shown in FIG. 3(B), the substrate 14 may define a recess 32 that serves to align the active material 12 on the substrate 14. In another embodiment, as shown in FIG. 3(C), one or more guide wafers 30 may be disposed on the substrate 14 around a desired attachment location to define the recess 32 and to align the active material 12 on the substrate 14 (or on layers that are provided on the substrate 14 such as the stop-etch layer 26 as is shown in FIG. 3(C)). The guide wafers 30 disposed on the substrate 14 may also be used as a stop surface 24 as described in further detail below. The embodiment of FIG. 3(C) may be advantageous because some integrated chip manufacturers prefer substrates 14 having standardized thicknesses. While the embodiments described above and shown in FIGS. 3(A)-3(C) are illustrative of suitable alignment mechanisms, it is to be appreciated that the instant invention is not limited to alignment of the active material 12 on the substrate 14 through any particular mechanism.

Figure 8:
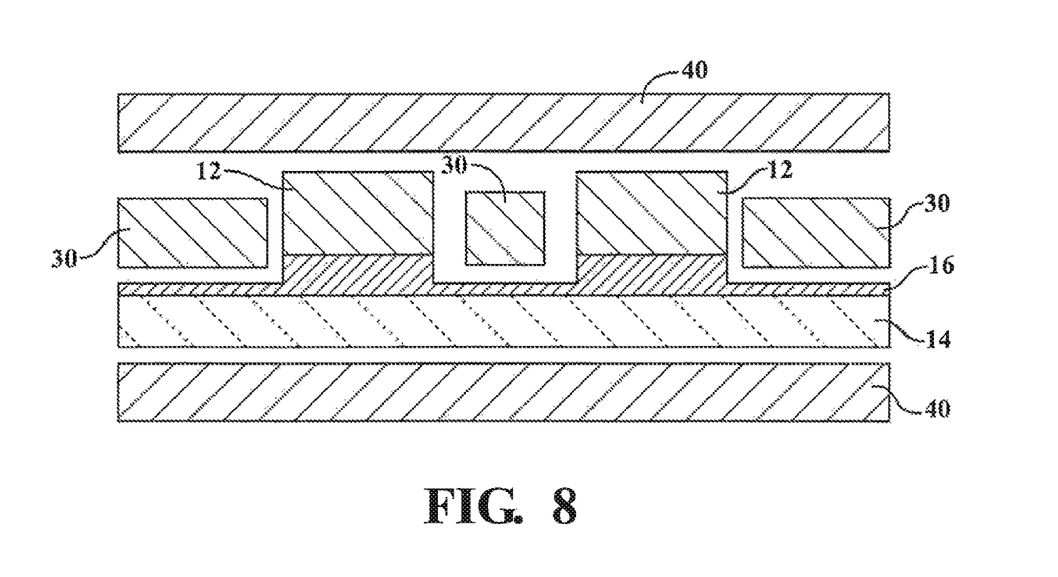
FIG. 8 is a schematic side view illustrating one embodiment by which an active material may be aligned with and bonded to a substrate using guide wafers in accordance with the method of the instant invention.
Figure 9:
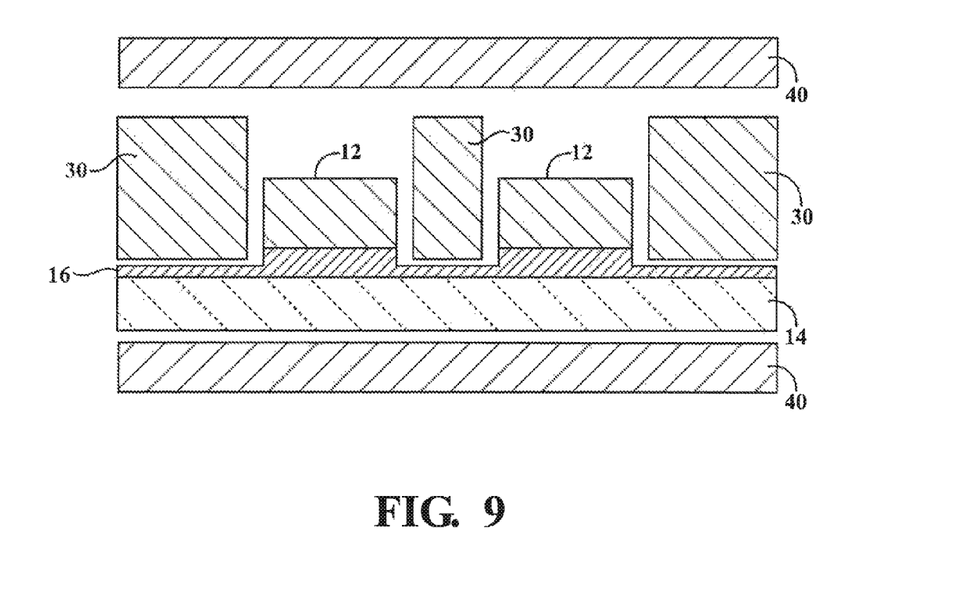
FIG. 9 is a schematic side view illustrating another embodiment by which an active material may be aligned with and bonded to a substrate using guide wafers in accordance with the method of the instant invention.

FIGS. 8 and 9 illustrate additional embodiments in which guide wafers 30 may be used to align the active material 12 with the substrate 14 for purposes of bonding the active material 12 and the substrate 14. FIGS. 8 and 9 illustrate use of bonding chucks 40 to facilitate application of pressure to the active material 12 and the substrate 14. FIG. 9 further illustrates the use of spacing blocks 42 to effectively provide extra thickness to the active material 12. To describe the process by which the active material 12 is aligned and bonded with the substrate 14, the guide wafer 30 may be aligned to the substrate 14 by use of alignment marks on both wafers (not shown). The active material 12 may then be placed through holes 46 or gaps in the guide wafer 30 so that the active material 12 is in contact with the substrate 14. As shown in FIG. 9, spacing blocks 42 may be placed on top of the active material 12 if the guide wafer thickness is larger than the thickness of the active material 12 (although, as shown in FIG. 8, this step is not used if thickness of the active material 12 is larger than guide wafer thickness). The active material 12 is then bonded to the substrate 14. The guide wafer 30 typically remains in position for alignment accuracy during bonding, but the guide wafer 30 is not bonded to the substrate 14 since no bond layer 16 is disposed between the guide wafer 30 and the substrate 14.

After the active material 12 is bonded to the substrate 14, the active material 12 bonded to the substrate 14 through the bond layer 16 is thinned to produce the film layer 22 of the thin-film device 10. After bonding of the active material 12 to the substrate 14, but before thinning, the substrate 14 may be coated with a thermally/chemically removable coating (such as photoresist, wax, PDMS, silicone, or parylene) in order to protect edges thereof during thinning. Examples of thinning techniques that are suitable for purposes of the instant method include, but are not limited to, grinding, lapping, polishing, CMP (chemical mechanical polishing), wet etching, dry etching, ion implant layer splitting, laser ablation, sand-blasting, ultrasonic machining, and focused-ion-beam etching. Typically, lapping is used to thin the active material 12 and to form the film layer 22.

Figure 4A:
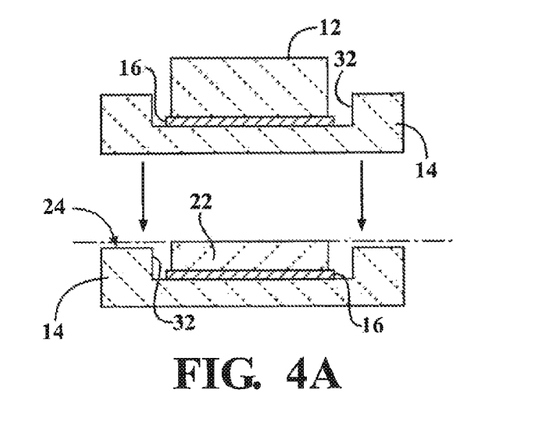
FIG. 4 is a schematic side view of two different embodiments by which an active material bonded to a substrate is thinned to form a film layer.
Figure 4B:
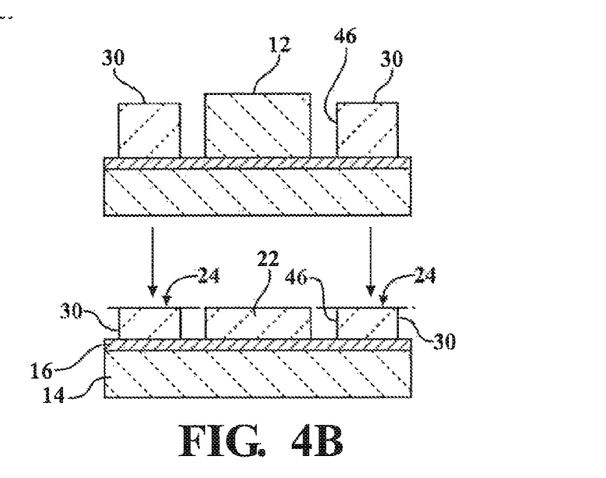
Figure 5A:
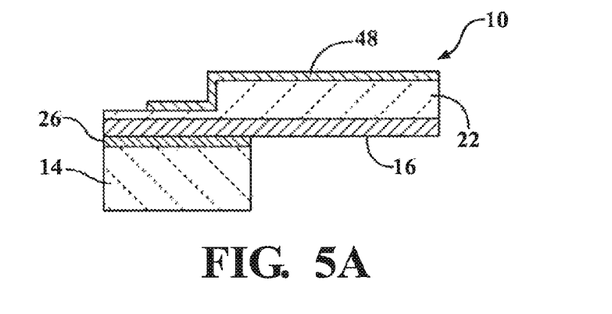
FIG. 5 provides four schematic side views of examples of thin-film devices that can be fabricated in accordance with the method of the instant invention.
Figure 5B:
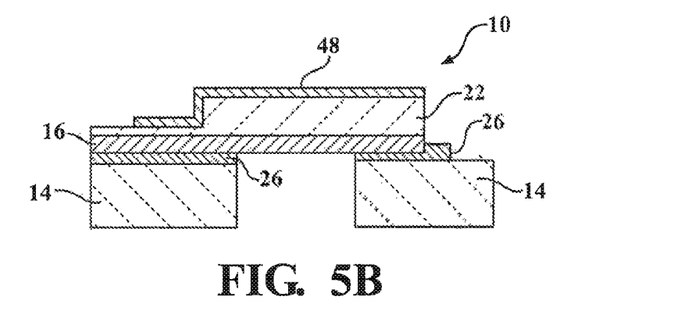
Figure 5C:
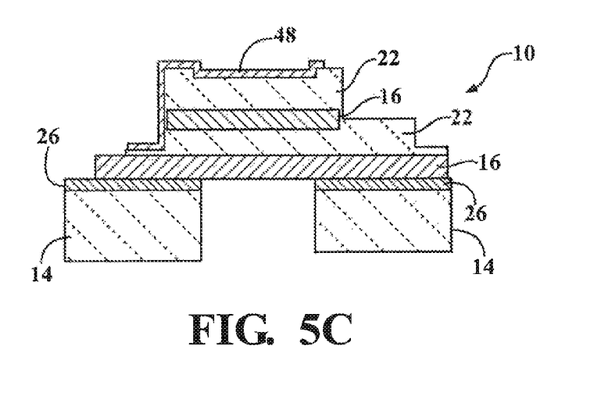
Figure 5D:
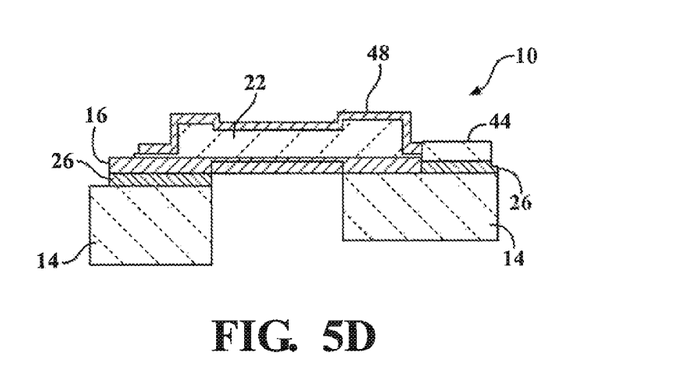
Figure 6A:
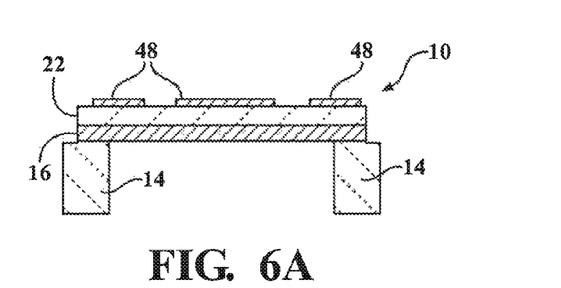
FIG. 6 provides two schematic side views of examples of additional thin-film devices that can be fabricated in accordance with the method of the instant invention.
Figure 6B:
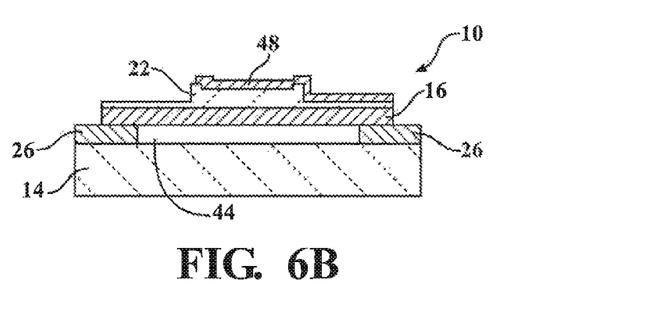

One desire during thinning is to obtain a uniform film thickness for the resulting film layer 22, and to have control over a material removal rate during thinning for repeatability. To assist with obtaining a uniform film thickness, as shown in FIG. 3, a stop surface 24 may be defined adjacent to the active material 12 that is bonded to the substrate 14, with the active material 12 protruding beyond the stop surface 24 as measured from the substrate 14. The stop surface 24 may assist with obtaining a precise thickness value for the film layer 22 by providing an indication that the desired thickness value for the film layer 22 has been achieved during thinning. For example, in one embodiment and as shown in FIG. 4(A)), the substrate 14 defines the recess 32, as described above (or guide wafers 30 are disposed on the substrate 14 to define the recess 32 as shown in FIG. 4(B)), with the active material 12 bonded to the substrate 14 in the recess 32. The substrate 14 or guide wafers 30 may define the stop surface 24 outside of the recess 32. Alternatively, as shown in FIG. 4(A)), a stop layer 26 may be disposed on the substrate 14, with a portion of the stop layer 26 disposed on the substrate 14 outside of the recess 32 defining the stop surface 24. Alternatively still, when the guide wafer 30 is disposed on the substrate 14 or the layer disposed on the substrate 14, the guide wafer 30 may define the stop surface 24. A depth of the recess 32 to be employed may be determined based upon total bond layer 16 thickness and a desired thickness of the film layer 22. When the active material 12 is thinned enough such that the surface of the substrate 14 (or stop layer 26, for example) outside of the recess 32 is exposed, a thinning speed will decrease considerably due to the increased surface area to thin down. In one embodiment, the stop layer 26, substrate 14, or guide wafer 30 (wherever the stop surface 24 is defined) comprises a harder material than the active material to provide a clear indication once the desired film thickness of the film layer 22 is achieved. The stop layer 26 may also be used as a stop-etch layer under circumstances in which back-etching of the substrate 14 is to be performed. In this regard, etching can be isolated to the desired portions of the substrate 14 without resulting in etching of the bond layer 16 or the film layer 22. In another embodiment, a portion of the bond layer 16 may be disposed on the substrate 14 outside of the active material 12, and the stop surface 24 may be defined on the bond layer 16 adjacent to the active material 12. The active material 12 is typically thinned to a thickness of from greater than 0 to about 100 μm, alternatively from about 2 μm to about 10 μm, alternatively from about 10 μm to about 30 μm.

Additionally, a thin shiny/metal layer (e.g. evaporated Au, not shown) may be deposited on top of the stop surface 24. Removal of the thin shiny layer during thinning may be utilized as an indication of the end of thinning process (meaning the desired thickness is reached).

Once the thinning process is completed, electrode 48 or isolation layer deposition and patterning can be completed with standard silicon processing techniques. For example, the instant method may further comprise the step of at least partially etching the substrate 14 to the bond layer 16 with the bond layer 16 shielding the active layer from etching. Wet/dry etching (e.g. DRIE or TMAH) of the substrate 14 underneath the desired sections may be used when the substrate 14 is silicon. Such etching of the substrate 14 may be utilized to partially release the film layer 22 from the substrate 14 by using the bond layer 16 as an etch-stop layer so that the film layer 22 is not exposed to etching. Release of the film layer 22 from the substrate 14 may be employed in order to create beam or diaphragm structures. In the case of wet etching, a front side of the thin film can be protected with an insulation layer.

Use of TLP bonding and polymer bonding (such as with parylene), under which circumstances the bond layer 16 is resistant to etching, is beneficial for obtaining a uniform and controllable film thickness for the film layer 22. If a layer that is resistant to etching is not used between the substrate 14 and the film layer 22 during etching, etching should be interrupted while there is still some substrate 14 remaining between the etching process and the film layer 22 so that the film layer 22 is not exposed to the etching process. However, this may cause different thickness values due to an uneven etch rates over the substrate 14, and may also result in thicker beams/diaphragms than what otherwise may be desired, and such difficulties may constrain miniaturization of the thin-film device 10. On the other hand, using the bond layer 16 alone to shield the film layer 22 enables very thin structures to be achieved, which structures may have increased sensing and actuating capabilities.

Alternatively, as alluded to above, a separate etch-stop layer 26 may be included between the bond layer 16 and the substrate 14 such that during etching of the substrate 14 (via dry/wet etching of the substrate 14), the separate etch-stop layer 26 (which may be a previously deposited thin-film under the bond layer 16 and which may comprise, e.g. metal oxide, oxide, nitride, parylene, etc. or a doped silicon region under the bond layer 16) can be used as a shield to etching instead of using the bond layer 16 as the etch-stop layer.

In one embodiment, the active material 12 can be patterned after bonding the active material to the substrate 14 and prior to thinning the active material 12. Alternatively, the film layer 22 can be patterned after bonding the active material 12 to the substrate 14 and after thinning the active material 12 to form the film layer 22. Patterning of the active material 12 prior to thinning may be preferred under some circumstances, especially if recessed portions 50 of the patterned active material 12 are filled with, e.g., a polymer, because the subsequent thinning step may effectively clean the surface from materials used to fill the recessed portions 50 of the patterned active material 12.

The film layer 22 can be patterned in complex shapes, such as via a computer controlled laser. Although this process is generally assumed to be slow due to its serial-writing, since the film layer 22 will be very thin and smart materials such as piezoelectric ceramics usually have low thermal conductivity, it is possible to obtain fast and scalable patterning with minimum thermal/mechanical damage to the remaining device 10. During laser ablation, the bond layer 16 can be used as an ablation stop layer with a proper adjustment of applied laser fluence (=laser power/spot area) to the target, by taking advantage of different ablation thresholds of ceramics (of the film layer 22) and metals (of the bond layer 16).

As alluded to above, the instant method may further comprise the step of bonding an additional active material 12 to the film layer 22. In one embodiment, the additional active material 12 may be bonded through another TLP bond to form an additional bond layer 16, and the additional active material 12 may be thinned to form an additional film layer 22. As set forth above, an advantage of bonding temperatures being lower than melting temperatures of the bond layer 16 is that the re-melting temperature may be higher than the bonding temperature used in additional bonding steps, even if the bond layer 16 and the additional bond layer 16 comprise common materials (e.g., the same materials). This is particularly true for TLP bond layers. This opens the option to bond additional active materials 12 to the film layer 22, and thin the additional active materials 12 to form the additional film layers 22, and to thereby obtain a multi-layer structure. As one example, when the thin-film device 10 is an energy scavenger or battery charger, harvested power can be doubled by using a bimorph structure of film layers 22 comprising piezoelectric materials instead of a unimorph structure. Or for an acceleration sensor, charge sensitivity can be increased by increasing the capacitance through use of the multi-layer structure. Examples of thin-film devices 10 that can be employed as energy scavengers, battery chargers, or acceleration sensors, are shown in FIGS. 5(A)-(D). Additionally, since device integrity will be conserved at a higher temperature than the bonding temperature, vacuum and hermetic packaging of the thin-film device 10 can be achieved with the same or other bonding techniques.

As an additional step, thermal annealing may be used on the substrate 14 including the film layer 22 bonded thereto, in order to decrease any residual stress in the final thin-film device 10.

One specific example of a thin-film device 10 in accordance with the instant invention may be a unimorph resonator including electrodes 48 on both a top and bottom of a film layer 22 (such as a piezoelectric film layer 22) or in-between the film layers 22 of a multi-layer structure. The piezoelectric film layer 22 may be patterned for actuation/sensing in d31-mode, d33-mode, d15-mode or a combination of these modes. The piezoelectric film layers 22 can be re-polarized after bonding and thinning processes if required depending on the bonding temperature and the Curie temperature of the chosen piezoelectric material.

Figure 7A:
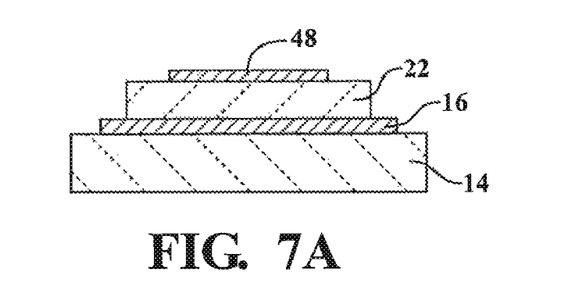
FIG. 7 provides two schematic side views of examples of additional thin-film devices that can be fabricated in accordance with the method of the instant invention.
Figure 7B:
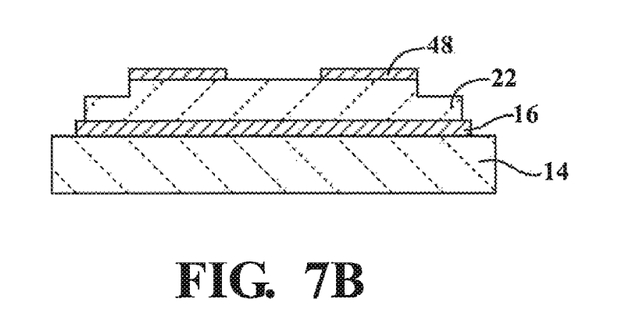

An additional specific example of a thin-film device 10 in accordance with the instant invention is shown in FIGS. 7(A) and (B) and includes use of a deposited thin stop layer 26 (such as metal oxide, oxide, nitride, parylene, etc.) between top electrodes 48 and a film layer 22 in order to provide isolation and prevent a possible short circuit between the top electrodes 48 and bottom electrodes due to grainy structure of the piezoelectric material. The stop layer 26 may also reduce leakage through the piezoelectric film layer 22 for lower power consumption during actuation or for improved charge/power output during sensing/energy-harvesting. The stop layer 26 may also filter/favor certain resonance modes by employing a combination of patterned stop layers 26 and patterned electrodes 48 on top of the film layer 22.

Figure 11:
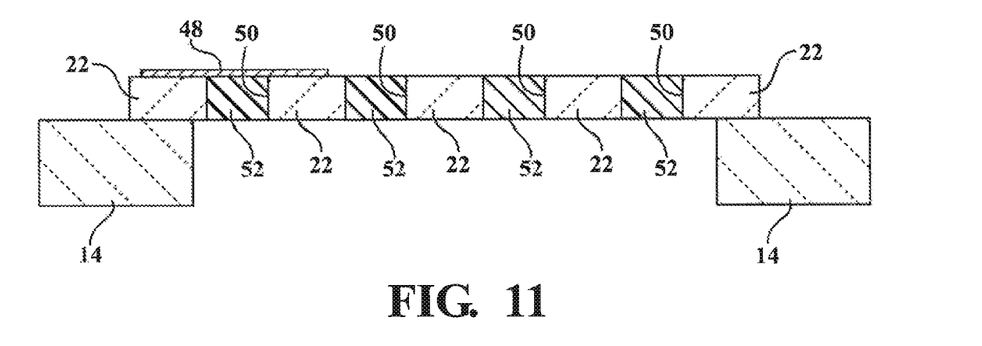
FIG. 11 is a schematic cross-sectional side view of another embodiment of a thin film device fabricated in accordance with the method of the instant invention.

An additional specific example of a thin-film device 10 in accordance with the instant invention is shown in FIG. 11. The device 10 includes a film layer 22 (such as a piezoelectric film layer 22) patterned into an array of columns or posts (via dry etching, wet etching, dicing, laser ablation, etc.). The bond layer 16 is optionally patterned depending on the desired mode of operation. Recessed portions 50 of the patterned film layer 22 (and, optionally, the bond layer 16) are filled with a polymeric material 52 (such as Parylene, PDMS, SU-8, non-conductive/conductive epoxy). In one embodiment, the active material 12 is patterned prior to thinning, with the recessed portions 50 filled with the polymeric material 52 prior to thinning such that there is no need to separately remove the excess polymeric material 52. Alternatively, the film layer 22 may be patterned after thinning, in which case a separate step of removing excess polymeric material 52 may be performed if necessary. An isolation layer (not shown) may optionally be deposited on the patterned piezoelectric film layer 22. Actuation/sensing electrodes 48 may optionally be deposited on the piezoelectric film layer 22. The device of FIG. 11 may be a thin film piezoelectric resonator, in which case an additional step of releasing the film layer 22 may be performed by front and/or backside etching of the substrate 14.

Figure 10:
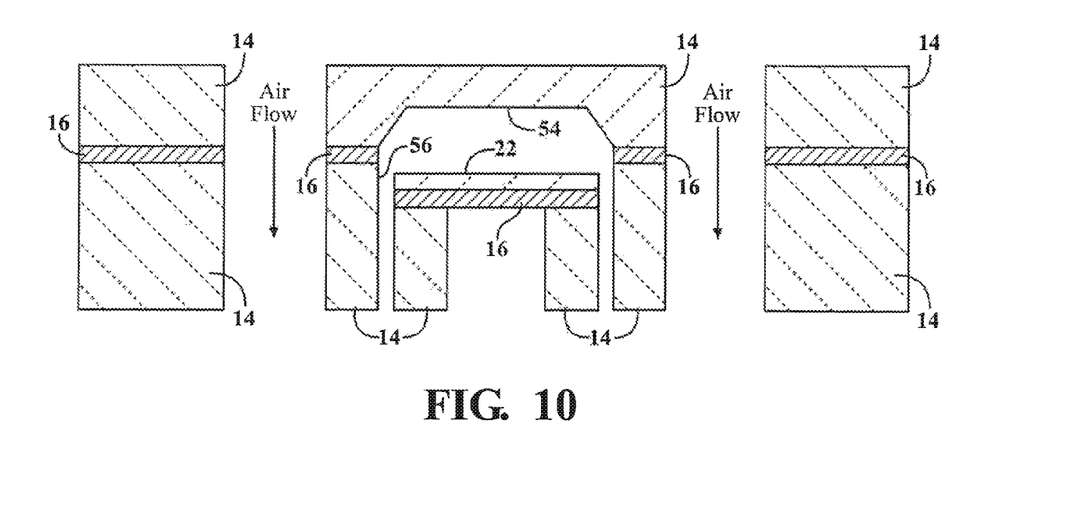
FIG. 10 is a schematic cross-sectional side view of another embodiment of a thin film device fabricated in accordance with the method of the instant invention.

An additional specific example of a thin-film device 10 in accordance with the instant invention is shown in FIG. 10. The device 10 of FIG. 10 may be used in a micro acoustic ejector, which may include a series of devices 10 shown in FIG. 10. The device 10 of FIG. 10 includes the piezoelectric film layer 22 in fluid communication with a chamber 54 that is optimized for Helmholtz resonance, and with jet holes 56 adjacent the chamber 54 to create acoustic streaming.

Figure 12:
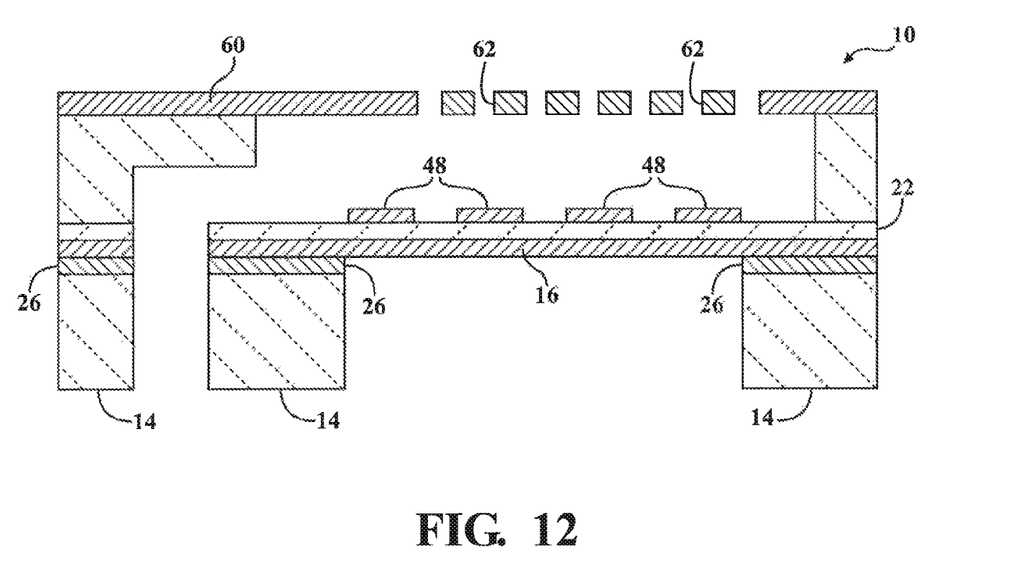
FIG. 12 is a schematic cross-sectional side view of another embodiment of a thin film device fabricated in accordance with the method of the instant invention.

An additional specific example of a thin-film device 10 in accordance with the instant invention may be a micro atomizer (as shown in FIG. 12) that includes a thin film piezoelectric diaphragm actuator fabricated with the instant method to include a film layer 22 bonded to a substrate 14 through a bond layer 16, with electrodes 48 disposed on the film layer 22. The device 10 is configured to force a liquid against a thin diaphragm 60 having micro-fabricated holes 62 to thereby spread the liquid out from the holes.

An additional specific example of a thin-film device 10 in accordance with the instant invention may be a multi-stage micro gas pump built by using series and parallel combinations of piezoelectric film layers 22 fabricated with the instant method, with passive or active valves integrated into the design.

Obviously, many modifications and variations of the present invention are possible in light of the above teachings, and the invention may be practiced otherwise than as specifically described within the scope of the appended claims. It is to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, it is to be appreciated that different, special, and/or unexpected results may be obtained from each member of the respective Markush group independent from all other Markush members. Each member of a Markush group may be relied upon individually and or in combination and provides adequate support for specific embodiments within the scope of the appended claims.

It is also to be understood that any ranges and subranges relied upon in describing various embodiments of the present invention independently and collectively fall within the scope of the appended claims, and are understood to describe and contemplate all ranges including whole and/or fractional values therein, even if such values are not expressly written herein. One of skill in the art readily recognizes that the enumerated ranges and subranges sufficiently describe and enable various embodiments of the present invention, and such ranges and subranges may be further delineated into relevant halves, thirds, quarters, fifths, and so on. As just one example, a range "of from 0.1 to 0.9" may be further delineated into a lower third, i.e., from 0.1 to 0.3, a middle third, i.e., from 0.4 to 0.6, and an upper third, i.e., from 0.7 to 0.9, which individually and collectively are within the scope of the appended claims, and may be relied upon individually and/or collectively and provide adequate support for specific embodiments within the scope of the appended claims. In addition, with respect to the language which defines or modifies a range, such as "at least," "greater than," "less than," "no more than," and the like, it is to be understood that such language includes subranges and/or an upper or lower limit. As another example, a range of "at least 10" inherently includes a subrange of from at least 10 to 35, a subrange of from at least 10 to 25, a subrange of from 25 to 35, and so on, and each subrange may be relied upon individually and/or collectively and provides adequate support for specific embodiments within the scope of the appended claims. Finally, an individual number within a disclosed range may be relied upon and provides adequate support for specific embodiments within the scope of the appended claims. For example, a range "of from 1 to 9" includes various individual integers, such as 3, as well as individual numbers including a decimal point (or fraction), such as 4.1, which may be relied upon and provide adequate support for specific embodiments within the scope of the appended claims.

What is claimed is:

1. A method of fabricating a thin-film device comprising a bond layer, a film layer having bulk material properties, and a substrate having a heat-sensitive component disposed thereon, said method comprising the steps of:
bonding an active material having bulk material properties to the substrate through the bond layer; and
thereafter, thinning the active material bonded to the substrate through the bond layer to produce the film layer of the thin-film device;
wherein the substrate is provided with the heat-sensitive component disposed thereon prior to bonding the active material to the substrate.

2. A method as set forth in claim 1 wherein the heat-sensitive component is further defined as an integrated circuit.

3. A method as set forth in claim 2 further comprising the step of fabricating the substrate including the integrated circuit prior to bonding the active material to the substrate.

4. A method as set forth in claim 1 wherein the active material is selected from the group of thermoelectric, piezoelectric, electrostrictive, magnetoelastic, ferromagnetic, ferromagnetic, and shape memory materials.

5. A method as set forth in claim 1 wherein the step of bonding occurs at a bonding temperature of less than or equal to about 300° C.

6. A method as set forth in claim 1 wherein the active material is provided with a bond component layer disposed thereon and the substrate is provided with an additional bond component layer disposed thereon.

7. A method as set forth in claim 6 wherein the active material is bonded to the substrate through a transient liquid phase bond to form the bond layer.

8. A method as set forth in claim 7 further comprising the step of bonding an additional active material to the film layer through a transient liquid phase solder bond to form an additional bond layer.

9. A method as set forth in claim 6 wherein a diffusion layer is disposed between the bond component layer and the active material.

10. A method as set forth in claim 1 wherein a melting temperature of the bond layer is greater than the bonding temperature.

11. A method as set forth in claim 1 wherein the active material is thinned to a thickness of from greater than 0 to about 100 μm to form the film layer.

12. A method as set forth in claim 1 wherein a stop surface is defined adjacent to the active material bonded to the substrate, with the active material protruding beyond the stop surface as measured from the substrate.

13. A method as set forth in claim 12 wherein the active material is thinned until a thinned surface of the active material is on even plane with the stop surface to produce the film layer of the thin-film device.

14. A method as set forth in claim 12 wherein the substrate defines a recess with the active material bonded to the substrate in the recess and with the substrate defining the stop surface outside of the recess.

15. A method as set forth in claim 12 wherein the substrate defines a recess with the active material bonded to the substrate in the recess, with a portion of a stop layer disposed on the substrate outside of the recess, and with the portion of the stop layer disposed on the substrate outside of the recess defining the stop surface.

16. A method as set forth in claim 15 wherein the stop layer comprises a harder material than the active material.

17. A method as set forth in claim 1 further comprising the step of patterning the active material after bonding the active material to the substrate and prior to thinning the active material.

* * * * *

UNITED STATES PATENT AND TRADEMARK OFFICE
CERTIFICATE OF CORRECTION

PATENT NO. : 8,209,857 B2
APPLICATION NO. : 12/819827
DATED : July 3, 2012
INVENTOR(S) : Khalil Najafi et al.

It is certified that error appears in the above-identified patent and that said Letters Patent is hereby corrected as shown below:

Column 2, line 64, delete the first occurrence of "ferromagnetic,"
Column 5, line 60, delete the first occurrence of "ferromagnetic,"
Column 15, line 38, delete the first occurrence of "ferromagnetic,"

Signed and Sealed this
Twenty-eighth Day of August, 2012

David J. Kappos
*Director of the United States Patent and Trademark Office*